United States Patent
Tchen et al.

(10) Patent No.: US 7,428,635 B2
(45) Date of Patent: Sep. 23, 2008

(54) METHOD OF WRITING NON-VOLATILE MEMORY THAT AVOIDS CORRUPTING THE VITAL INITIALIZATION CODE

(75) Inventors: Weimin Tchen, Costa Mesa, CA (US); Marcia Ann Kasilowski, Costa Mesa, CA (US)

(73) Assignee: Emulex Design & Manufacturing Corporation, Costa Mesa, CA (US)

( * ) Notice: Subject to any disclaimer, the term of this patent is extended or adjusted under 35 U.S.C. 154(b) by 421 days.

(21) Appl. No.: 10/816,312

(22) Filed: Mar. 31, 2004

(65) Prior Publication Data
US 2005/0223268 A1  Oct. 6, 2005

(51) Int. Cl.
*G06F 12/00* (2006.01)
(52) U.S. Cl. .......................... 713/2; 711/103
(58) Field of Classification Search ............ 713/2; 711/103
See application file for complete search history.

(56) References Cited

U.S. PATENT DOCUMENTS

| | | | |
|---|---|---|---|
| 6,308,265 B1 * | 10/2001 | Miller | 713/2 |
| 6,442,067 B1 * | 8/2002 | Chawla et al. | 365/185.11 |
| 7,162,568 B2 * | 1/2007 | Huang et al. | 711/102 |
| 2003/0217257 A1 * | 11/2003 | Ebsen et al. | 713/100 |
| 2005/0055595 A1 * | 3/2005 | Frazer et al. | 713/400 |
| 2005/0125650 A1 * | 6/2005 | Chen et al. | 713/2 |

* cited by examiner

*Primary Examiner*—Suresh Suryawanshi
*Assistant Examiner*—Albert Wang
(74) *Attorney, Agent, or Firm*—Morrison & Foerster LLP

(57) ABSTRACT

A method for avoiding the possibility of corruption when updating vital code such as boot code stored in nonvolatile memory of a unit, such as a host bus adapter, or adapter circuitry integrated onto a motherboard, or a computer system, is disclosed. Prior to updating the vital code, the method determines if the attempted update is unnecessary or regressive by reading and comparing the region version number in nonvolatile memory to the version number in the update code. If the update is unnecessary, the user is alerted. In addition, the method tests the ability to update/write to the nonvolatile memory by performing a write test operation to a less vital region prior to updating the vital region. The less vital region may comprise a test region set aside in the nonvolatile memory for performing write tests, or it may be an application region reserved for storing application programs.

38 Claims, 2 Drawing Sheets

METHOD OF WRITING NON-VOLATILE MEMORY THAT AVOIDS CORRUPTING THE VITAL INITIALIZATION CODE

BACKGROUND OF THE INVENTION

1. Field of the Invention

This invention is a method and apparatus for updating computer program code stored in nonvolatile memory, in a way that that reduces the chance of corrupting the part of the code used for initialization.

2. Description of Related Art

Referring to FIG. 1, a unit that contains a general processor, such as a computer system 106 or an adapter 100, requires code to initialize (boot). Because the processor 114 or 130 in such a unit must be able to access boot code 116 using basic hardware access, the boot code 116 must be stored in nonvolatile memory 118. Nonvolatile memory, includes, but is not limited to, Read-Only Memory (ROM), Electrically Programmable Read-Only Memory (EPROM), Electrically Erasable Programmable Read-Only Memory (EEPROM), Flash memory, and the like. Flash memory is the nonvolatile memory of choice in many modern applications. However, unlike conventional RAM, whose data can be simply read or written, flash memory is setup to be read-only during normal operations and requires special procedures to be written.

In the example of an adapter, when a unit is booted, the processor 114 is directed to a particular address in the nonvolatile memory 118, where it begins executing boot code 116 in boot region 122. It is important that this boot code 116 run correctly, otherwise the unit 100 will not initialize correctly and basic operations will fail. Moreover, a host computer system 106 containing this unit may in turn fail to boot. For example, if the boot operations fail in a device located in the host computer system 106, the entire computer system may fail to boot. Thus, care is required in updating the boot code.

Although the above discussion describes how the processor 114 in a unit 100 such as a HBA (Host Bus Adapter) uses nonvolatile memory for initialization, the processor 130 in the host computer system 106 also utilizes nonvolatile memory in a similar fashion. For reliability, the nonvolatile memory of the host computer system 106 may similarly be divided into boot code and application code. The boot code is executed when the host computer system 106 is first turned on to initialize the host computer system 106, and the application code is run in order to read a mass storage device, such as a disk drive. Then the operating system code that is stored on the disk can be loaded and run. One program that is typically stored in nonvolatile memory of a host computer is the Basic Input/Output System (BIOS).

In order to support new technology or to correct problems, it may become necessary or desirable to update the code in nonvolatile memory. If the nonvolatile memory is flash memory, then a program can be run in situ to update the BIOS used by the host computer or to update the code stored in an adapter. This saves the expense of removing the nonvolatile memory from the unit and updating it with specialized equipment, usually at the manufacturer's site.

When a program is used to update nonvolatile memory, care must be taken to handle the varied environments at customer sites. For example, with some flash memory, an entire block of memory must be erased before writing can commence. If the erase operation is successful, then write operations can proceed, often one byte at a time. Once a block is erased, it cannot be reverted and a new block of code must be successfully written in its place. As each byte is written, it should be checked to verify that the code was written correctly. If a problem is detected, the write operation may be re-tried several times. Once an entire block is written, the entire block may be verified byte-by-byte. A checksum or a cyclic redundancy check (CRC) may also be performed to validate the code being written.

On occasion, problems with updating nonvolatile memory can arise. For example, loss of power would prematurely terminate update operations. If an adapter was reset while being updated, the bus mapping of the adapter could change and writes to the nonvolatile memory could fail. Another source of problems is PCI bus version incompatibility. For example, when updating an adapter in a host system that is not PCI 2.1 compliant, the REQ64 and ACK64 bus signals may be left floating. As a result, incorrect addresses may be used in updating the adapter's nonvolatile memory and the code written to nonvolatile memory can be corrupted.

If the boot code is corrupted but the unit is currently using the application code, the unit will not immediately be affected by the error. However, the error will cause problems the next time the boot code is utilized, at the next power-up or when the unit is reset. For example, in the case of corrupt boot code in an adapter attached to the PCI bus of a host computer, when the host computer is powered up, its BIOS will identify and communicate with every adapter in its PCI bus. If an adapter fails its boot operations, either the adapter will be skipped by the host system or it may cause the host system's BIOS to fail. Because the host computer cannot identify or communicate with the adapter, it cannot update the nonvolatile memory in the adapter. Thus, the only recourse at that time is to send the adapter back to the manufacturer.

To avoid corruption of the nonvolatile memory, some units divide the nonvolatile memory code into regions so that each update-code file contains just one region such as the boot code region or the application code region, or combinations thereof. With multiple update files, a user can pick and choose which regions of memory to update without having to update the entire nonvolatile memory. In addition, the user may be prohibited from updating certain areas of memory. For example, only the application firmware might be placed in an update-code file and made available to a user. If the user performs an update with that update-code file, only the application region would be updated, leaving the boot region intact. Without this fragmentation and restriction of the update-code files, a user believing that "more is better" may choose to update all the regions or unnecessary regions, increasing the likelihood of updating errors. Other manufacturers suggest avoiding updating the boot code in their documentation.

In any case, because the image file selection process is manually performed, if the user is given a menu of available image files for updating, there is no mechanism for preventing a user from updating vital regions that do not need updating. Even when it is necessary to update the boot code region, current solutions do not first test the ability to write in a non-vital region, nor do they warn the user that an update is unnecessary or regressive.

Thus, a need exists for an apparatus and method for updating nonvolatile memory that warns the user that an update is unnecessary or regressive, and also tests the ability to write in a non-vital region prior to updating a vital region.

SUMMARY OF THE INVENTION

Processors such as those found in an adapter typically access nonvolatile memory such as flash memory for executing initialization routines (boot code) stored in the boot region of the nonvolatile memory, upon power-up or re-boot, and also for copying application code stored in the application region of the nonvolatile memory (which is used to perform product-specific functions). At times, it may be desirable or necessary to update this code (firmware) stored in the nonvolatile memory. However, if incorrect or corrupted code is written to the boot region of nonvolatile memory, it may not be possible to correct this code.

To avoid the possibility of such corruption, embodiments of the present invention determine if an attempted update to a vital region (e.g. the boot region) of the nonvolatile memory is unnecessary or regressive. This is done by reading and comparing the version number of the code stored in the vital region to the version number of the new (update) code prior to performing the update. The invention also tests the ability to update/write to the nonvolatile memory prior to actually updating the vital region by first performing and verifying a "write test" operation in a less vital region (e.g. a test region).

The first step that may be performed before updating the vital region of nonvolatile memory is "version checking." In version checking, the version of the existing code in the vital region is compared to the update code. If the versions match, or if the existing version is more recent than the update code, then the update is not performed, thereby avoiding unnecessary updates and minimizing the chance of a write error.

If the version comparison indicates that an update is appropriate, then the next step is to perform a test by initializing (unlocking and erasing) a block in a less vital region and performing a write test operation to that block. During initialization, an erase command is issued to the block, and an attempt is made to verify that the erase command was successful. If the erase command was unsuccessful, the erase command may be re-tried a few times before the update program terminates. If the erase command was successful, then a write test is done to the erased block. Both the status of the write command and a verification of the data are checked to see if the write was successful. If the write command was unsuccessful the write test command may be re-tried a few times before the update terminates. Once an entire block in the less vital region has been erased, written and verified, the update to the vital regions can proceed. Optionally, prior to performing the actual write operation, the write test could be extended to multiple blocks to more closely simulate an actual update. In this embodiment, multiple blocks in the less vital region may be erased one block at a time, and may be written and verified one byte at a time, before the actual write operation is initiated.

The nonvolatile memory may contain an application region and, provided there is enough free space available, a test region. Both the application region and test region are less vital regions as compared to the boot region. In embodiments of the present invention, the operations of initializing and writing described above are preferably performed in the test region. If the write test operation to the test region fails, both the boot region and application regions are still intact and the unit can function with the old code. If the write test operation is successful, then an update is performed in the boot region and application region as necessary.

If a test region is not available, the operations of initializing and writing may be performed in the application region. If the write test operation to the application region fails, the boot region is still intact and the unit can boot with the old code to allow the application region to be correctly rewritten. If the write test operation is successful, then the boot region and application updates can proceed.

DETAILED DESCRIPTION OF PREFERRED EMBODIMENTS

Figure 1:
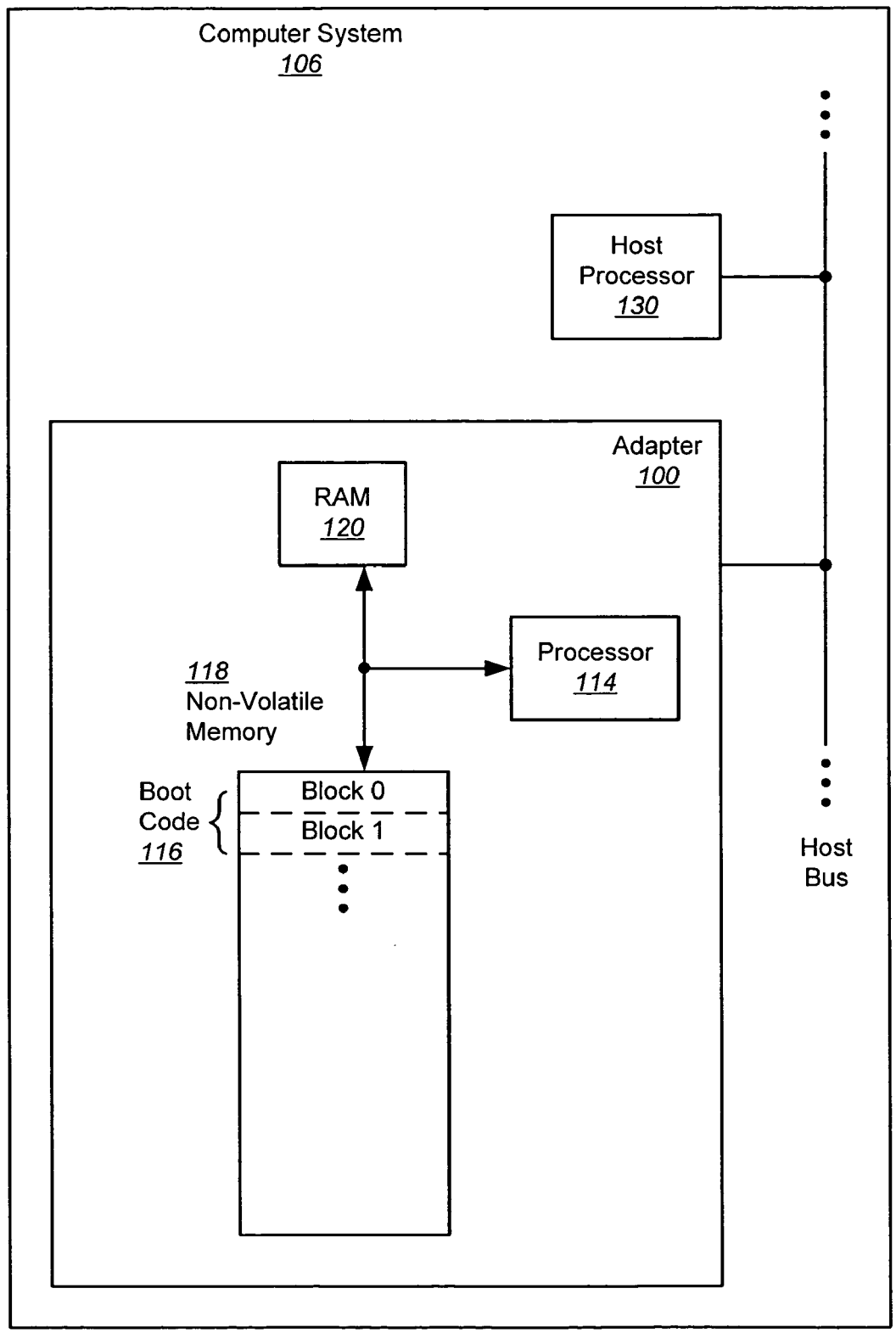
FIG. 1 is an exemplary block diagram illustrating a system environment comprising a host computer containing a unit such as a host bus adapter (HBA).

In the following description of preferred embodiments, reference is made to the accompanying drawings, which form a part hereof, and in which is shown by way of illustrating specific embodiments in which the invention may be practiced. It is to be understood that other embodiments may be utilized and structural changes may be made without departing from the scope of the preferred embodiments of the present invention.

It should also be noted that although embodiments of the present invention are primarily described herein in terms of updating the boot region of nonvolatile memory in HBAs for purposes of illustration and discussion only, embodiments of the present invention are applicable to updates of any region in nonvolatile memory, such as the application region, and to other hardware (e.g. personal computers (PCs) or other computing devices) containing processors that must be booted from nonvolatile memory, and most generally to any situation in which nonvolatile memory must be updated.

HBA processors typically access nonvolatile memory such as flash memory for executing initialization routines (e.g. boot code) in vital boot regions of the nonvolatile memory upon power-up or re-booting, and for copying or executing application code stored in application regions of the nonvolatile memory for performing the HBA's intended function. At times, it may be desirable or necessary to update this code (firmware) stored in the nonvolatile memory. However, if incorrect or corrupted data is written to the boot region of nonvolatile memory, the HBA may not initialize properly and it may not be possible to correct the corrupted data. If this HBA is a PCI card in a host computer, the corruption may cause the host computer to hang up upon power-up or re-boot, or may cause the host computer to fail to identify the HBA. An HBA corrupted in this way would no longer be usable by a customer and would have to be returned to the vendor.

To avoid the possibility of such corruption, embodiments of the present invention determine if an attempted update of the nonvolatile memory is unnecessary or regressive. This is done by reading and comparing the region's version number to the update code's version number prior to performing the update. In addition, the invention also tests the ability to update/write to the nonvolatile memory prior to actually updating the vital region by first performing and verifying a "write test" operation in a less vital region (e.g. a test region). The present invention may reside in an update or flash program that is executed when an update to the nonvolatile memory is desired. This invention is applicable to a variety of host computers or processors embedded in adapters such as HBAs.

The write test operation is intended to help users prevent corruption to the vital nonvolatile memory of HBAs or processors when updating code in the boot region is inadvertently attempted in a physically defective system or an environment that does not meet requirements.

Figure 2:
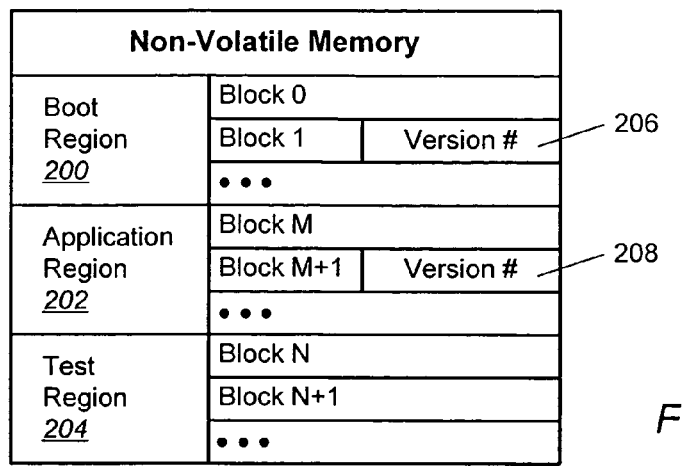
FIG. 2 illustrates an exemplary arrangement of a nonvolatile memory into boot, application and test regions according to embodiments of the present invention.

FIG. 2 illustrates an exemplary arrangement of a nonvolatile memory divided into boot region 200, application region 202, and test region 204 according to embodiments of the present invention, although the test region 204 is optional. As defined herein, the boot region is a more vital region than the application and test regions, and the application region is a more vital region than the test region. A version number (206, 208) is maintained in each of the boot and application regions so that each region can be checked individually before that region is updated. Note that the version number may optionally be followed by a checksum, date information, and the like.

Figure 3:
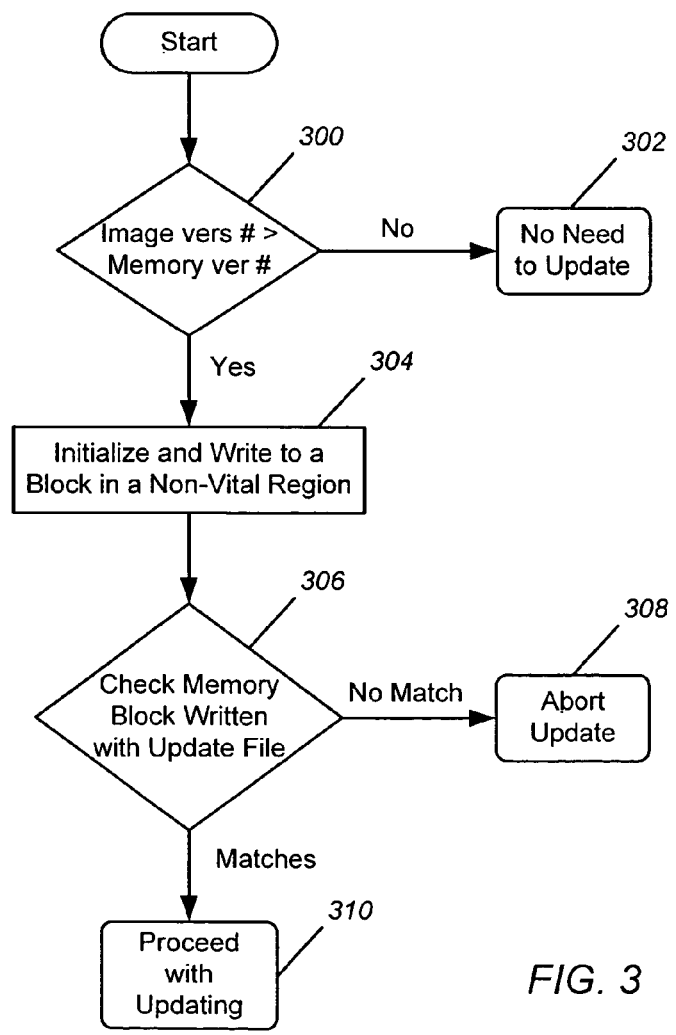
FIG. 3 is an exemplary flow chart of an update or flash program for updating nonvolatile memory according to embodiments of the present invention.

FIG. 3 is an exemplary flow diagram of a program for updating nonvolatile memory according to embodiments of the present invention. The update program can be executed from the host computer with code sent across the PCI bus to update nonvolatile memory in the HBA, or it can be run in firmware within the HBA to update the nonvolatile memory in the HBA.

The first step that is performed before updating a particular region in the nonvolatile memory is version checking. This version checking step, although illustrated in FIG. 3, is optional and may be omitted. At step 300, the version of the existing code in the region of nonvolatile memory to be updated is compared to the update code. If the versions match, or if the existing (memory) version is more recent than the update (image) version, then the update is not performed (see 302), thereby avoiding unnecessary updates and minimizing the chance of a write error. In one embodiment, the version number includes both major and minor revision levels (e.g. v2.1), and both are checked against what is contained in the update file.

In one embodiment of the present invention, when the update program is executed, the display for the host computer may indicate the current version number of the boot code stored in the nonvolatile memory of the HBA, and the version number of the update file. In one embodiment, the display may query the user as to whether the update program should proceed. In another embodiment, if the versions are identical, the update program may automatically terminate. The update program may also perform a CRC on the contents of the nonvolatile memory and on the update file prior to updating to ensure that they are still valid, and the outcome of the CRC may be displayed to the user.

If the version comparison indicates that an update to a vital region is appropriate, then the next step is to perform a write test by initializing (unlocking and erasing) and performing a write test to a block in a less vital region at 304. However, before the write test is performed, the memory type is identified so that the appropriate commands (e.g. read, write, erase) and sequences can be sent. To identify the memory type, an identifier command may be issued to the nonvolatile memory by the update program, and the nonvolatile memory will respond with an identifier. Once the memory type is known, the update program may utilize a table listing various types and sizes of nonvolatile memory supported by the update program to determine the appropriate commands to be sent. The addresses for the write test operation are established and the block boundaries are identified (because certain operations take place on these boundaries). Depending on the memory type, it may be necessary to unlock each block to be erased and re-written (and then lock each block at the end so that it can only be read). An erase command is then issued to a single block and verified. If unsuccessful, the erase command may be re-tried a few times, but if the erase continues to be unsuccessful, the update program may terminate. If the erase command is successful, then one byte may be written. The byte is then verified at step 306 by checking it against the update file (i.e. a verification of test status and data). If the write is unsuccessful, the write test command may be re-tried a few times, but if the write continues to be unsuccessful, the update program may provide status information and terminate. This process of writing and verifying one byte at a time continues for the rest of the block, then other blocks are erased one block at a time, and then written and verified one byte at a time. Note, however, that in other embodiments, the erase and write sizes could be different. In other embodiments, it may also be possible to verify the written data by reading back entire words or blocks at a time to speed the operation.

As described above, the nonvolatile memory contains an application region and, provided there is enough free space available, a test region. In embodiments of the present invention, the operations of initializing and writing described above are preferably performed in the test region. If the test region is utilized, then the update file intended for the boot region could be written into the test region, or any other test file could be written. If the write test operation to the test region fails, the update program may report an error status and terminate at 308. However, because the firmware in the boot and application regions of the non-volatile memory was preserved, the adapter is left in an entirely functional state. The adapter may then be taken to a known working environment and updated there.

If a test region is not available, the operations of initializing and writing may be performed in the application region. If the write test operation to the application region fails, the boot region of the adapter is left intact and bootable. The application firmware could then be restored by taking the device to a known working environment and updated there. In other words, although the card will not operate as an iSCSI or fibre channel HBA, for example, the device will still be able to identify itself correctly to the host computer and set up the PCI interface so that the host computer can still communicate with the device at a basic level. If the write test operation is successful, then the update is performed at 310.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. In a processing unit including nonvolatile memory for storing executable code, the nonvolatile memory comprising a vital region for storing vital code and a region for storing less vital code, an apparatus for executing an update program for managing updates to the vital region of the nonvolatile memory with update code, the apparatus comprising:

a processor programmed for
issuing an identifier command to the nonvolatile memory;
receiving from the nonvolatile memory an identifier that identifies a memory type of the nonvolatile memory to determine appropriate commands to be sent;
performing a write test by writing test code into multiple blocks in the less vital region and verifying test status and data of each block to simulate an actual update to the vital region, and
performing an actual write of the update code into the vital region if the write test is successful.

2. The apparatus as recited in claim 1, each region of the nonvolatile memory of the processing unit having a version number and likewise each region of the update code having a version number, the processor further programmed for:
   comparing the version number of the update code and the version number of the nonvolatile memory for a given region, and
   executing the update program only if the version number of the update code is greater than the nonvolatile memory code version number.

3. The apparatus as recited in claim 2, wherein a location within each vital region is allocated to store the version number, the processor further programmed to access this location to retrieve the version number from the nonvolatile memory.

4. The apparatus as recited in claim 3, the processor further programmed for writing the version number of the update code into the allocated area in that region of nonvolatile memory if the write test is successful.

5. The apparatus as recited in claim 2, the processor further programmed for terminating the update without performing any write operations if the version number of the update code is less than or equal to the nonvolatile memory version number for each vital region.

6. The apparatus as recited in claim 2, the processor further programmed for querying a user whether the update program should proceed if the version number of the update code is less than or equal to the nonvolatile memory version number.

7. The apparatus as recited in claim 1, wherein the vital region is a boot region and the non-vital region is a test region.

8. The apparatus as recited in claim 1, wherein the vital region is a boot region and the less vital region is an application region.

9. The apparatus as recited in claim 8, wherein the test code is equivalent to application code currently stored in the application region of nonvolatile memory.

10. The apparatus as recited in claim 1, wherein the test code is equivalent to the update code.

11. A host bus adapter (HBA) comprising the apparatus of claim 1, the HBA for implementing upper layer protocols (ULPs).

12. The HBA of claim 11, further comprising an Internet Small Computer System Interface (iSCSI) or a fibre channel controller circuit.

13. A host computer comprising the HBA of claim 12.

14. A storage area network (SAN) comprising the host computer of claim 13, wherein an iSCSI or a fibre channel network is coupled to the iSCSI or fibre channel controller circuit and one or more storage devices are coupled to the iSCSI or fibre channel network.

15. In a processing unit including nonvolatile memory for storing executable code, the nonvolatile memory comprising a vital region for storing vital code and a region for storing less vital code, a computer program for managing updates to the vital region of the nonvolatile memory with update code, the computer program being stored on flash memory and executable to perform acts comprising:
   issuing an identifier command to the nonvolatile memory;
   receiving from the nonvolatile memory an identifier that identifies identifying a memory type of the nonvolatile memory to determine appropriate commands to be sent;
   performing a write test by writing test code into multiple blocks in the less vital region in nonvolatile memory and verifying test status and data of each block to simulate an actual update to the vital region; and performing an actual write of the update code into the vital region in nonvolatile memory, if the write test is successful.

16. The computer program as recited in claim 15, each region of the nonvolatile memory of the processing unit having a version number and the update code having a version number, the computer program further executable to perform acts comprising:
   comparing the version number of the update code and the version number of the nonvolatile memory for a given region, and
   updating the vital region of the nonvolatile memory only if the version number of the update code is greater than the nonvolatile memory version number.

17. The computer program as recited in claim 16, wherein a location within each vital region is allocated to store the version number, the computer program further executable to perform acts comprising accessing this location to retrieve the version number from both the nonvolatile memory and the update code.

18. The computer program as recited in claim 17, the computer program further executable to perform acts comprising writing the version number of the update code into the allocated area in that region of nonvolatile memory if the write test is successful.

19. The computer program as recited in claim 16, the computer program further executable to perform acts comprising terminating the update program without performing any write operations if the version number of the update code is less than or equal to the nonvolatile memory version number for each vital region.

20. The computer program as recited in claim 16, the computer program further executable to perform acts comprising querying a user whether the update program should proceed if the version number of the update code is less than or equal to the nonvolatile memory code version number.

21. The computer program as recited in claim 15, wherein the vital region is a boot region and the non-vital region is a test region.

22. The computer program as recited in claim 15, wherein the vital region is a boot region and the less vital region is an application region.

23. The computer program as recited in claim 22, wherein the test code is equivalent to application code currently stored in the application region of nonvolatile memory.

24. The computer program as recited in claim 15, wherein the test code is equivalent to the update code.

25. A host bus adapter (HBA) comprising the processing unit and the computer program stored in the flash memory of claim 15, the HBA for implementing upper layer protocols (ULPs).

26. The HBA of claim 25, further comprising an Internet Small Computer System Interface (iSCSI) or a fibre channel controller circuit.

27. A host computer comprising the HBA of claim 26.

28. A storage area network (SAN) comprising the host computer of claim 27, wherein an iSCSI or fibre channel network is coupled to the iSCSI or fiber channel controller circuit and one or more storage devices are coupled to the iSCSI or fibre channel network.

29. In a processing unit including nonvolatile memory for storing executable code, the nonvolatile memory comprising a vital region for storing vital code and a region for storing less vital code, a method for executing an update program for managing updates to the vital region of the nonvolatile memory with update code, the method comprising:
   issuing an identifier command to the nonvolatile memory;
   receiving from the nonvolatile memory an identifier that identifies a memory type of the nonvolatile memory to determine appropriate commands to be sent;

performing a write test by writing test code into multiple blocks in the less vital region and verifying test status and data of each block to simulate an actual update to the vital region, and performing an actual write of the update code into the vital region if the write test is successful.

30. The method as recited in claim 29, each region of the nonvolatile memory of the processing unit having a version number and the update code having a version number, the method further comprising:

comparing the version number of the update code and the version number of the nonvolatile memory for a given region, and executing the update program only if the version number of the update code is greater than the nonvolatile memory code version number.

31. The method as recited in claim 30, wherein a location within each vital region is allocated to store the version number, the method further comprising accessing this location to retrieve the version number from the nonvolatile memory.

32. The method as recited in claim 31, further comprising writing the update code version number of the update code into the allocated area in that region of nonvolatile memory if the write test is successful.

33. The method as recited in claim 30, further comprising terminating the update without performing any write operations if the version number of the update code is less than or equal to the nonvolatile memory code version number for each vital region.

34. The method as recited in claim 30, further comprising querying a user whether the update program should proceed if the version number of the update code is less than or equal to the nonvolatile memory code version number.

35. The method as recited in claim 29, wherein the vital region is a boot region and the less vital region is a test region.

36. The method as recited in claim 29, wherein the vital region is a boot region and the less vital region is an application region.

37. The method as recited in claim 36, wherein the test code is equivalent to application code currently stored in the application region.

38. The method as recited in claim 29, wherein the test code is equivalent to the update code.

\* \* \* \* \*